US012599048B2

(12) United States Patent
Nakata et al.

(10) Patent No.: US 12,599,048 B2
(45) Date of Patent: Apr. 7, 2026

(54) SEMICONDUCTOR DEVICE COMPRISING SUBMODULE HAVING AT LEAST AN UPPER SURFACE EXPOSED AND METHOD OF MANUFACTURING THE SEMICONDUCTOR DEVICE

(71) Applicant: Mitsubishi Electric Corporation, Tokyo (JP)

(72) Inventors: Yosuke Nakata, Tokyo (JP); Norikazu Sakai, Tokyo (JP); Yuji Sato, Tokyo (JP); Yoshinori Yokoyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 409 days.

(21) Appl. No.: 18/306,765

(22) Filed: Apr. 25, 2023

(65) Prior Publication Data

US 2024/0047430 A1     Feb. 8, 2024

(30) Foreign Application Priority Data

Aug. 2, 2022     (JP) ................................. 2022-123054

(51) Int. Cl.
H01L 25/07          (2006.01)
H01L 21/56          (2006.01)
(Continued)

(52) U.S. Cl.
CPC ............ H01L 25/072 (2013.01); H01L 21/56 (2013.01); H01L 23/053 (2013.01); H01L 23/3135 (2013.01); H01L 24/32 (2013.01); H01L 24/40 (2013.01); H01L 24/73 (2013.01); H01L 24/83 (2013.01); H01L 25/50 (2013.01); H05K 7/1427 (2013.01); *H01L 2224/32245* (2013.01);
(Continued)

(58) Field of Classification Search
CPC ...... H01L 25/072; H01L 21/56; H01L 23/053
USPC ......................................................... 257/723
See application file for complete search history.

(56) References Cited

U.S. PATENT DOCUMENTS

2017/0110978 A1     4/2017     Lai et al.
2019/0229032 A1     7/2019     Oonishi et al.
2021/0193538 A1*    6/2021     Huang ................ H01L 23/3675

FOREIGN PATENT DOCUMENTS

JP          2006-310558 A     11/2006
WO          2018/047474 A1     3/2018

OTHER PUBLICATIONS

An Office Action; "Notice of Reasons for Refusal," mailed by the Japanese Patent Office on May 13, 2025, which corresponds to Japanese Patent Application No. 2022-123054 and is related to U.S. Appl. No. 18/306,765; with English language translation.

* cited by examiner

*Primary Examiner* — Quoc D Hoang
(74) *Attorney, Agent, or Firm* — Studebaker Brackett PLLC

(57)          ABSTRACT

An object is to provide a technique capable of easily taking out a submodule from a semiconductor device to reuse the submodule. The semiconductor device includes: a submodule in which a conductive plate and a semiconductor element mounted to an upper surface of the conductive plate via a first bonding material are sealed with a first sealing material; an insulating substrate bonded to a lower surface of the submodule via a second bonding material; a case surrounding a periphery of the insulating substrate and the submodule; and a second sealing material sealing a region surrounded by the case so that at least an upper surface of the submodule is exposed.

15 Claims, 6 Drawing Sheets

(51) Int. Cl.

| | | |
|---|---|---|
| *H01L 23/00* | (2006.01) | |
| *H01L 23/053* | (2006.01) | |
| *H01L 23/31* | (2006.01) | |
| *H01L 25/00* | (2006.01) | |
| *H05K 7/14* | (2006.01) | |

(52) U.S. Cl.

CPC ............... *H01L 2224/40175* (2013.01); *H01L 2224/73263* (2013.01); *H01L 2224/83801* (2013.01)

FIG. 4

SEMICONDUCTOR DEVICE COMPRISING SUBMODULE HAVING AT LEAST AN UPPER SURFACE EXPOSED AND METHOD OF MANUFACTURING THE SEMICONDUCTOR DEVICE

FIELD OF THE INVENTION

The present disclosure relates to a semiconductor device and a method of manufacturing the semiconductor device.

DESCRIPTION OF THE BACKGROUND ART

For example, International Publication No. 2018/047474 discloses a semiconductor device including a plurality of submodules. In a technique described in International Publication No. 2018/047474, a submodule made up of a plurality of SiC chips (corresponding to a semiconductor element) sandwiched by upper and lower electrodes is incorporated into a semiconductor device, and then sealing with sealing resin is performed to insulate a periphery of the SiC chips.

SUMMARY

However, in the technique described in Patent Document 1, the submodule is wholly sealed with the sealing resin, thus if the submodule is reused to manufacture the other semiconductor device, it is difficult to take out the submodule from the semiconductor device.

An object of the present disclosure is to provide a technique capable of easily taking out a submodule from a semiconductor device to reuse the submodule.

A semiconductor device according to the present disclosure includes a submodule, an insulating substrate, a case, and a second sealing material. In the submodule, a conductive plate and a semiconductor element mounted to an upper surface of the conductive plate via a first bonding material are sealed with a first sealing material. The insulating substrate is bonded to a lower surface of the submodule via a second bonding material. The case surrounds a periphery of the insulating substrate and the submodule. The second sealing material seals a region surrounded by the case so that at least an upper surface of the submodule is exposed.

The submodule is not completely covered by the second sealing material, but at least the upper surface of the submodule is exposed, thus the submodule can be easily taken out from the semiconductor device without melting the second sealing material. Accordingly, the submodule can be reused.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a cross-sectional view of a semiconductor device according to a modification example of the embodiment 1.

DESCRIPTION OF THE PREFERRED EMBODIMENTS

Embodiment 1

<Configuration of Submodule>

Figure 1:
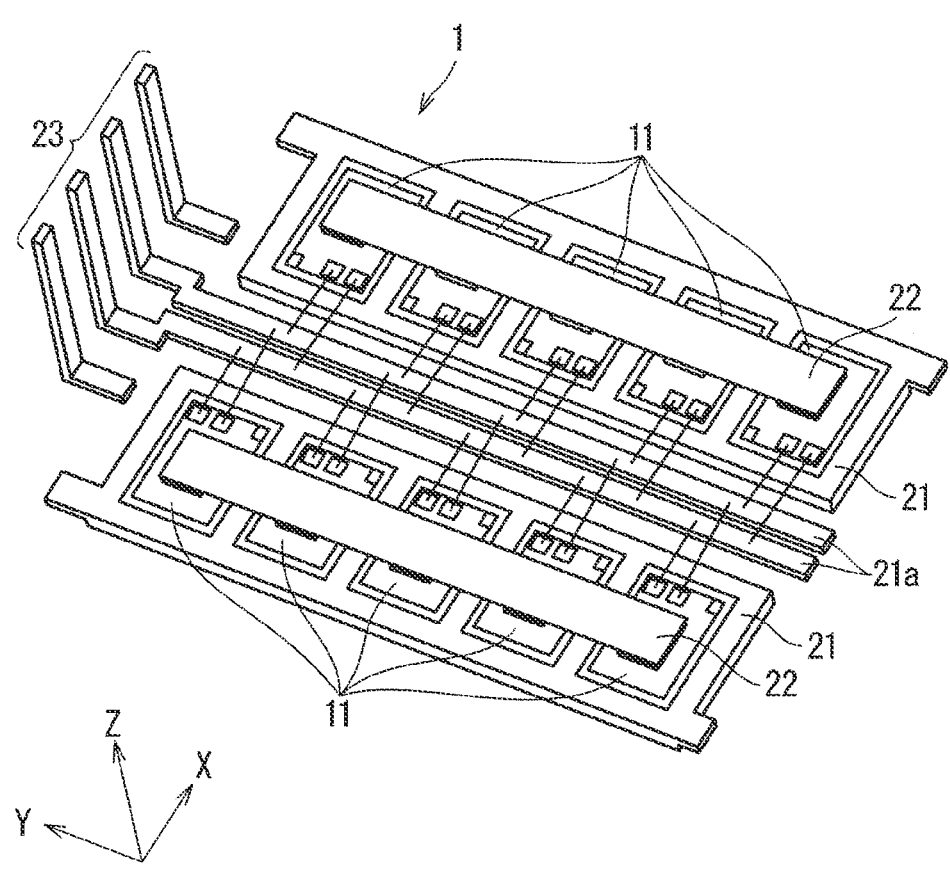
FIG. 1 is a perspective view illustrating an inner structure of a submodule included in a semiconductor device according to an embodiment 1.
Figure 2:
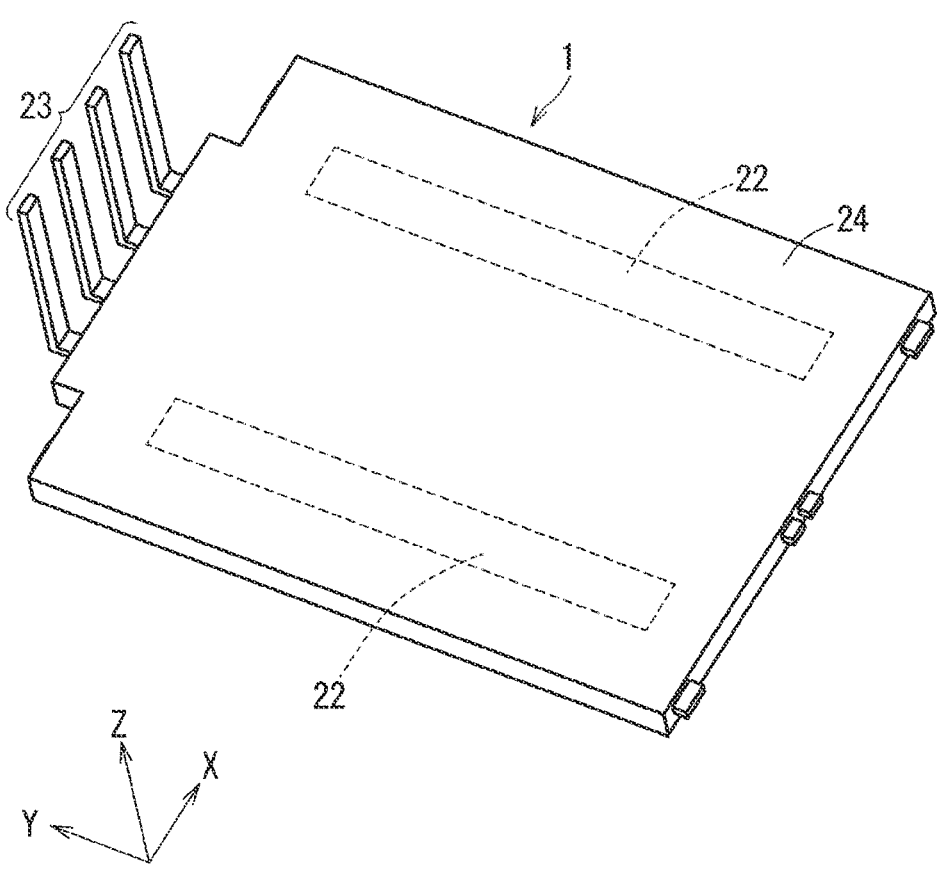
FIG. 2 is a perspective view illustrating the submodule included in the semiconductor device according to the embodiment 1.

An embodiment 1 is described hereinafter using the drawings. FIG. 1 is a perspective view illustrating an inner structure of a submodule 1 included in a semiconductor device according to the embodiment 1. FIG. 2 is a perspective view of the submodule 1 included in the semiconductor device according to the embodiment 1. FIG. 1 is a drawing illustrating a state where a first sealing material 24 is removed from the submodule 1 to easily see the inner structure.

In FIG. 1, an X direction, a Y direction, and a Z direction are perpendicular to each other. An X direction, a Y direction, and a Z direction illustrated in the subsequent drawings are also perpendicular to each other. In the description hereinafter, a direction including the X direction and a –X direction as a direction opposite to the X direction is also referred to as "an X axis direction". In the description hereinafter, a direction including the Y direction and a –Y direction as a direction opposite to the Y direction is also referred to as "a Y axis direction". In the description hereinafter, a direction including the Z direction and a –Z direction as a direction opposite to the Z direction is also referred to as "a Z axis direction".

As illustrated in FIG. 1 and FIG. 2, the submodule 1 includes two conductive plates 21, two lead frames 21a, ten semiconductor elements 11, two conducting electrodes 22, four signal terminals 23, and the first sealing material 24.

The number of the semiconductor elements 11 can be changed, and the number of each of the conductive plates 21, the lead frames 21a, the conducting electrodes 22, and the signal terminals 23 can be changed in accordance with the number of the semiconductor elements 11.

Each conductive plate 21 is formed into a rectangular shape in a top view. Two conductive plates 21 are disposed side by side in the X axis direction so that long sides thereof are adjacent to each other. One end portions (end portions in the –Y direction) of the long sides on an outer peripheral side of two conductive plates 21 are formed to be longer than one end portions of the long sides on an inner peripheral side thereof while two conductive plates 21 are arranged side by side.

Two lead frames 21a are disposed side by side in the X axis direction so as to be adjacent to each other in a longitudinal direction between two conductive plates 21. A length of each lead frame 21a in the longitudinal direction is the same as a length of the long sides on the outer peripheral side of two conductive plates 21 arranged side by side.

Figure 3:
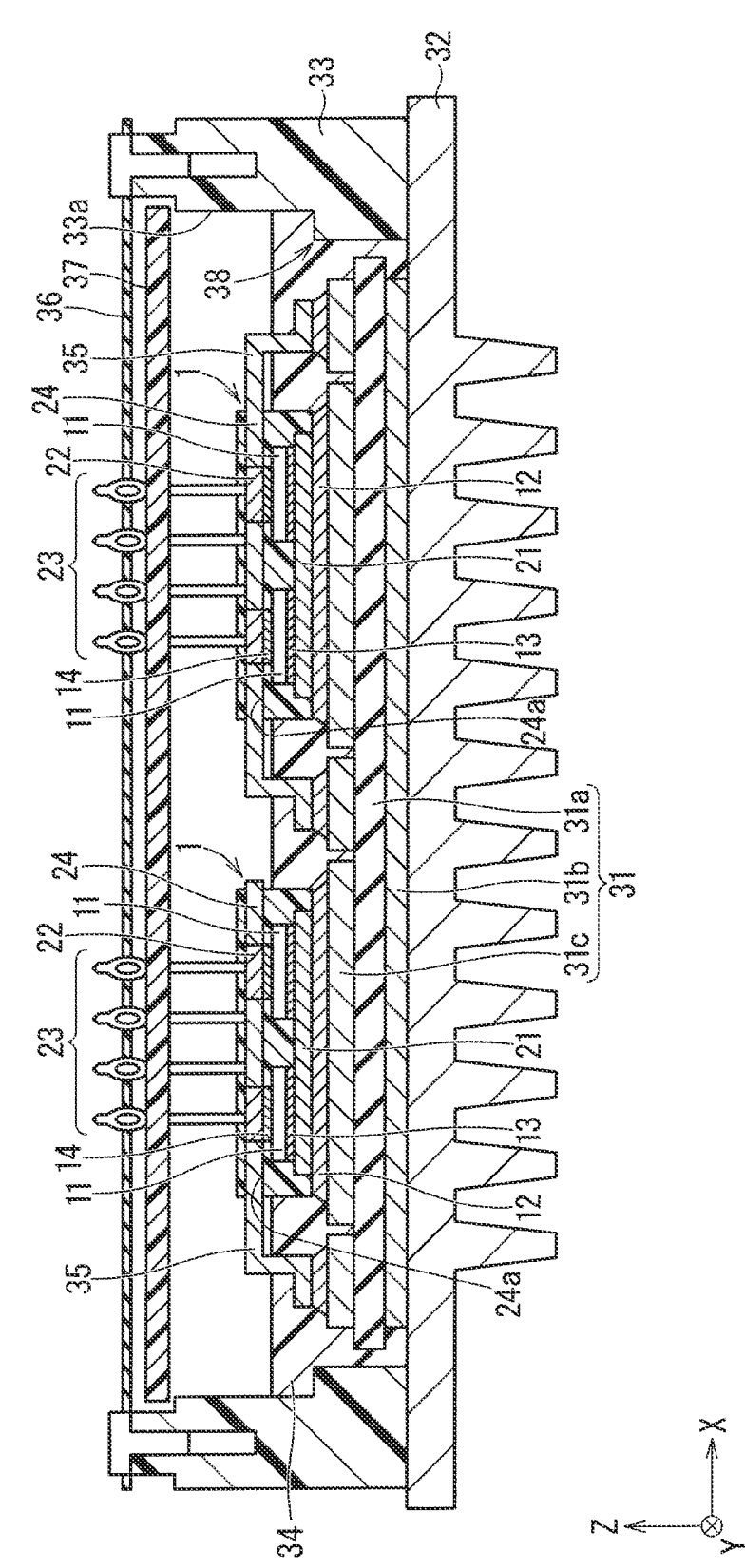
FIG. 3 is a cross-sectional view of the semiconductor device according to the embodiment 1.

Five semiconductor elements 11 are mounted to the upper surface (surface in the Z direction) of each conductive plate 21 via a first bonding material 13 (refer to FIG. 3). A source electrode and a gate electrode not shown in the drawings are provided to the upper surface (surface in the Z direction) of each semiconductor element 11, and a drain electrode not shown in the drawings is provided to a lower surface (surface in the –Z direction) of each semiconductor element 11. Each conductive plate 21 is bonded to the drain electrode of five semiconductor elements 11 via the first bonding material 13 (refer to FIG. 3). Each conducting electrode 22 is connected to the source electrode of five semiconductor elements 11.

The semiconductor element 11 is made up of a so-called wide bandgap semiconductor such as SiC or GaN, for example. The semiconductor element 11 is a metal oxide semiconductor field effect transistor (MOSFET). Five semiconductor elements 11 are connected in parallel to each other along the Y axis direction in each conductive plate 21 in the submodule 1. The semiconductor 11 may also be a diode, an insulated gate bipolar transistor (IGBT), or a reverse-conducting IGBT (RC-IGBT), for example, as well as the MOSFET.

A control pad (gate electrode, for example) not shown in the drawings is provided to each semiconductor element 11. A gate signal is inputted from the control pad, thus an ON-OFF state of each semiconductor element 11 is controlled.

The control pad of the semiconductor element 11 may include not only the gate electrode (gate pad) to which gate drive voltage for controlling the ON-OFF state of the semiconductor element 11 is applied but also a current sensing pad, kelvin source pad, or a temperature sensing diode pad, for example, although not shown in the drawings.

The current sensing pad is a control pad for sensing current flowing in a cell region in the semiconductor element 11. Specifically, the current sensing pad is a control pad electrically connected to a part of a cell region so that current, which is a fraction to some in tens thousands of current flowing in the whole cell region, flows when the current flows in the cell region in the semiconductor element 11.

The kelvin source pad is a control pad to which gate drive voltage for controlling the ON-OFF state of the semiconductor element 11 is applied.

The temperature sensing diode pad is a control pad electrically connected to an anode and a cathode of a temperature sensing diode provided to the semiconductor element 11 but not shown in the drawings. Voltage between the anode and the cathode of the temperature sensing diode provided in the cell region is measured to measure a temperature of the semiconductor element 11.

Four signal terminals 23 are formed into an L-like shape in a side view, and are disposed on a side of the other end portions (Y direction) of two conductive plates 21. Two signal terminals 23 on a center side in four signal terminals 23 are formed integrally with the lead frame 21*a*. One end portions of four signal terminals 23 are electrically connected to the control pads of ten semiconductor elements 11. A control signal is inputted to the signal terminal 23 from outside, ten semiconductor elements 11 are controlled at the same time. The other end portions of four signal terminals 23 are bended to extend to an upper side (Z direction).

As illustrated in FIG. 2, two conductive plates 21, ten semiconductor elements 11, and two conducting electrodes 22 are sealed with the first sealing material 24. The other end portions of four signal terminals 23 protrude to be exposed from a side surface of the first sealing material 24 in the Y direction.

<Configuration of Semiconductor Device>

A configuration of the semiconductor device is described next. FIG. 3 is a cross-sectional view of the semiconductor device according to the embodiment 1.

As illustrated in FIG. 3, the semiconductor device includes two submodules 1, an insulating substrate 31, a cooler 32, a case 33, a case cover 37, a second sealing material 34, two connection members 35, and a control substrate 36. The semiconductor device is a functional semiconductor device including the plurality of semiconductor elements 11, specifically constitutes a circuit such as an inverter or a converter, and further includes a control function or a protection function.

The insulating substrate 31 is bonded to a lower surface (surface in the −Z direction) of the submodule 1 via a second bonding material 12. The insulating substrate 31 is further bonded to an upper surface (surface in the Z direction) of the cooler 32.

The insulating substrate 31 includes an insulating layer 31*a*, a lower surface pattern 31*b*, and a circuit pattern 31*c*. The circuit pattern 31*c* is provided to an upper surface (surface in the Z direction) of the insulating layer 31*a*, and the lower surface pattern 31*b* is provided to a lower surface (surface in the −Z direction) of the insulating layer 31*a*. The circuit pattern 31*c* is divided into a plurality of pieces.

The circuit pattern 31*c* is made of Cu as a main material, for example, and the insulating layer 31*a* is made of ceramics such as silicon nitride, aluminum oxide, or aluminum nitride as a main material, for example.

When expensive SiC is used for the semiconductor element 11, silicon nitride is used as a main material for the insulating layer 31*a* in many cases to increase a cooling property. The lower surface pattern 31*b* for being bonded to the cooler 32 is further provided on a side of the cooler 32 (−Z direction) of the insulating substrate 31, and is made of Cu as a main material in the manner similar to the circuit pattern 31*c*.

The cooler 32 is a pin fin including a water-cooling pin standing on a cooling surface, for example, and is made of Cu as a main material. At least a surface of the cooling surface is covered with a Ni-based material. An area of the cooler 32 in a top view is larger than an area of the insulating substrate 31 in a top view, and the insulating substrate 31 is bonded to a mounting surface (surface in Z direction) of the insulating substrate 31 in the cooler 32, that is to say, a region except for a peripheral edge portion of the cooler 32.

The case 33 surrounding the periphery of the insulating substrate 31 and the submodule 1 is bonded to the peripheral edge portion of the mounting surface (surface in the Z direction) of the insulating substrate 31 in the cooler 32. The case 33 is formed into a rectangular frame-like shape in a top view, and the second sealing material 34 fills a region surrounded by the case 33. The region surrounded by the case 33 is specifically a region surrounded by the case 33 and the cooler 32. The case cover 37 is detachably attached to the case 33 on an upper end portion (end portion in Z direction) of the case 33.

Two connection members 35 are connected to four conducting electrodes 22 included in two submodules 1. When this configuration is described, a hole 24*a* extending to a side portion of the conducting electrode 22 is formed on right and left side surfaces (side surfaces in the X axis direction) of each submodule 1. The hole 24*a* is also formed between two conducting electrodes 22 in each submodule 1. Each connection member 35 electrically connects two conducting electrodes 22 in each module 1 and the circuit pattern 31*c* via the hole 24*a*.

The second sealing material 34 seals the insulating substrate 31 and a portion of the submodule 1 except for the upper surface (surface in the Z direction). The second sealing material 34 fills a region up to a portion near an upper end portion (end portion in Z direction) of the submodule 1. Thus, the upper end portion of the submodule 1 is exposed from the second sealing material 34.

A level difference 38 protruding to an inner peripheral side is provided over a whole periphery in an inner peripheral wall 33a of the case 33. The level difference 38 is provided on a lower side (−Z direction) of a center portion of the case 33 in a height direction (Z axis direction). An area of a portion on an upper side (Z direction) of the level difference 38 in a top view is larger than an area of a portion on a lower side (−Z direction) of the level difference 38 in a top view in the region surrounded by the case 33.

Accordingly, in a step of filling the region with the second sealing material 34, after filling the region with the second sealing material 34 up to the upper side (Z direction) of the circuit pattern 31c of the insulating substrate 31, a speed of increasing a volume of the second sealing material 34 is reduced, and the upper surface (surface in the Z direction) of the submodule 1 can be more reliably exposed from the second sealing material 34.

Eight signal terminals 23 included in two submodules 1 are connected to the control substrate 36. Each signal terminal 23 has one end portion as a press fit terminal, and when one end portions of eight signal terminals 23 are inserted into eight holes formed in the control substrate 36 but not shown in the drawings, respectively, eight signal terminals 23 and the control substrate 36 are electrically connected to each other.

The control substrate 36 is disposed on an upper side (Z direction) of the submodule 1. More specifically, the control substrate 36 is disposed on an upper end portion (end portion in the Z direction) of the case 33 and on an upper side (Z direction) of the case cover 37. The control substrate 36 is electrically connected to ten semiconductor elements 5 via four signal terminal 23 of each submodule 1 to control ten semiconductor elements 5.

<Method of Manufacturing Semiconductor Device>

Described briefly next is a method of manufacturing a semiconductor device and a method of manufacturing the other semiconductor device using the submodule 1 which has been taken out. The method of manufacturing the semiconductor device is described firstly.

Firstly, the semiconductor element 11 is mounted to an upper surface (surface in the Z direction) of the conductive plate 21 via the first bonding material 13 to prepare the submodule 1 including the conductive plate 21 and the semiconductor element 11 sealed with the first sealing material 24. Next, the lower surface (surface in the −Z direction) of the submodule 1 and the insulating substrate 31 are bonded by the second bonding material 12, the case 33 is disposed to surround the periphery of the insulating substrate 31 and the submodule 1, and the region surrounded by the case 33 is sealed with the second sealing material 34 so that at least the upper surface of the submodule 1 is exposed.

After filling the region with the second sealing material 34, the case cover 37 is attached to the case 33, and one end portion of the signal terminal 23 is exposed from the case cover 37 and connected to the control substrate 36. It is preferable that the case cover 37 is attached to the case 33 by a method easily removed from the case 33 in a step of taking out the submodule 1, and is fixed to the case 33 by bonding with an adhesive agent or fitting into the case 33, for example. The semiconductor device is thereby completed.

Described next is a method of manufacturing the other semiconductor device using the submodule 1 which has been taken out. Firstly, the submodule 1 is taken out from the second sealing material 34 in the semiconductor device described above. A material having Young's modulus lower than that of the first sealing material 24 is preferably used for the second sealing material 34. For example, when the first sealing material 24 is made up of epoxy system resin, the second sealing material 34 is preferably made up of gel or rubber. Accordingly, the submodule 1 can be easily separated and taken out from the second sealing material 34.

Herein, a width of the signal terminal 23 is generally smaller than that of the conducting electrode 22, thus even when the other end portion of the signal terminal 23 is embedded in the second sealing material 34, the second sealing material 34 hardly interferes with the processing of taking out the submodule 1.

A melting point of the first bonding material 13 bonding the conductive plate 21 and the semiconductor element 11 is preferably higher than that of the second bonding material 12 bonding the submodule 1 and the circuit pattern 31c of the insulating substrate 31. For example, it is preferable that the first bonding material 13 is a sintering bonding material made of Ag or Cu as a main material, and the second bonding material 12 is a solder material made of Sn as a main material. Even when the second bonding material 12 as a solder material is melted by thermal processing at a temperature of 200° C. to 300° C. to take out the submodule 1, the first bonding material 13 as a sintering bonding material in the submodule 1 does not reach a melting point, thus the submodule 1 can be stably taken out.

The lower surface (surface in the −Z direction) of the submodule 1 which has been taken out and the other insulating substrate 31 different from the insulating substrate 31 described above are bonded by the other second bonding material 12 different from the second bonding material 12 described above, the other case 33 different from the case 33 described above is disposed to surround the periphery of the other insulating substrate 31 and the submodule 1, and the region surrounded by the other case 33 is sealed with the other second sealing material 34 different from the second sealing material 34 described above so that at least the upper surface of the submodule 1 is exposed. The other semiconductor device using the submodule 1 which has been taken out is thereby completed.

Although not described above, an inspection step for certifying that the submodule 1 can be reused is performed on the submodule 1 which has been taken out. The inspection step is an electrical inspection on the semiconductor element 11, a comparative verification with initial supply data, an electrical screening examination, a mechanical verification such as an ultrasonic flaw testing, or an appearance inspection of the submodule 1, for example, and any combination thereof or all of the inspections are performed to verify quality of the submodule 1 as a reused module as usage.

When the conductive plate 21 and the insulating substrate 31 are bonded by a solder material, an intermetallic compound layer made of Sn may remain on the surface of the conductive plate 21 from which the solder is removed, thus performed is a regeneration step, such as a step of mechanically removing the intermetallic compound layer or an Sn plating process to restore the reused submodule 1 to a re-mountable state, which is necessary to obtain an appropriate bonding interface in a step of mounting the inverter again. In the step of mounting the inverter again, solder bonding may be performed in the manner similar to the initial step, or a bonding method with a high melting point such as sintering bonding may be used when the submodule 1 is not to be reused.

The conducting electrode 22 can be bonded by ultrasonic bonding with a wire or a ribbon as a wiring material, and the submodule 1 is detached in a pulling step when the submodule 1 is taken out. If a residue is generated, polishing processing is performed on the submodule 1 so that a condition of the submodule 1 does not have influence on next bonding. When the residue is small enough, the polishing processing is not performed but a wiring material mounted again is connected away from the residue and a part deformed by ultrasonic bonding, thus the submodule 1 can be reused more easily.

Modification Example of Embodiment 1

Figure 4:
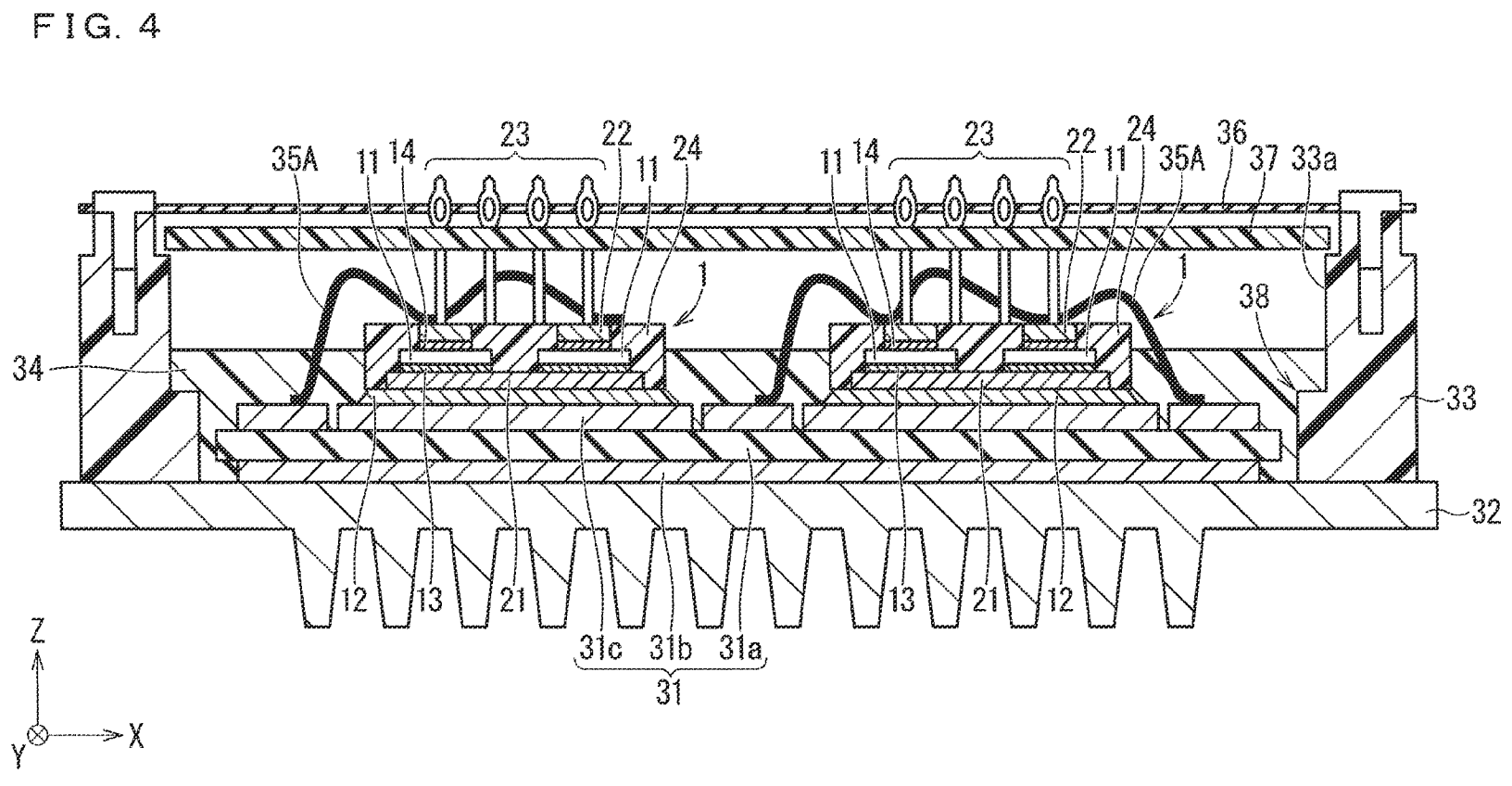

A modification example of the embodiment 1 is described next. FIG. 4 is a cross-sectional view of a semiconductor device according to a modification example of the embodiment 1.

As illustrated in FIG. 4, in the modification example of the embodiment 1, the conducting electrode 22 is exposed to the upper surface (surface in the Z direction) of the submodule 1, and furthermore, the semiconductor device includes two connection members 35A in place of two connection members 35.

In the submodule 1 on a left side (–X direction) in FIG. 4, a portion on one end side of the connection member 35A is connected to the upper surface (surface in the Z direction) of the conducting electrode 22. In the meanwhile, the other end portion of the connection member 35A is connected to the circuit pattern 31c. In the submodule 1 on a right side (X direction) in FIG. 4, a portion of the connection member 35A on a center side in a longitudinal direction is connected to the upper surface (surface in the Z direction) of the conducting electrode 22. In the meanwhile, one end portion and the other end portion of the connection member 35A are connected to the circuit pattern 31c. Accordingly, each connection member 35A electrically connects two conducting electrodes 22 in each module 1 and the circuit pattern 31c.

At this time, the portion of the connection member 35A on the center side in the longitudinal direction is exposed from the second sealing material 34. In this case, an insulation distance can be made long, thus even when the second sealing material 34 partially exposes the submodule 1, insulation properties can be easily and reliably ensured.

In the case in FIG. 3 where the connection member 35A is not used, the conducting electrode 22 is taken out from the side surface of the submodule 1, thus a distance from the conducting electrode 22 to the circuit pattern 31c is reduced, thus it may be difficult to adjust an amount of filling with the second sealing material 34 to insulate the conducting electrode 22 and the circuit pattern 31c. However, when the connection member 35A is used, filling with the second sealing material 34 can be stopped at an optional height position (position in the Z axis direction) on the side surface of the submodule 1, thus the insulation properties can be easily and reliably ensured.

The connection member 35A may have a loop shape on the upper surface (surface in the Z direction) of the submodule 1. Accordingly, a strap can be inserted into this loop shape to apply raising force at the time of taking out the submodule 1.

Action and Effect

When the inverter using the submodule 1 is reused, the cooler 32, the second bonding material 12, the case 33, and a control terminal (not shown) attached to the case 33, for example, are refurbished, and the inverter is formed by reusing only the submodule 1. Thus, it is preferable that the submodule 1 can be easily taken out from the inverter and attached again, and further has high reliability and can be easily inspected.

Particularly, an inverter for an automobile, demand for which has been recently increased, includes a semiconductor device integrated with a pin fin and a cooling structure, and are highly integrated and downsized in many cases, thus it is difficult to repair a damage occurring in reusing the inverter. When the submodule 1 can be easily taken out and then inspected to be able to ensure reliability, the submodule 1 can be used for the inverter again in the manner similar to the new submodule.

The semiconductor device according to the embodiment 1 and the modification example thereof includes: the submodule 1 in which the conductive plate 21 and the semiconductor element 11 mounted to the upper surface (surface in the Z direction) of the conductive plate 21 via the first bonding material 13 are sealed with the first sealing material 24; the insulating substrate 31 bonded to the lower surface of the submodule 1 via the second bonding material 12; the case 33 surrounding the periphery of the insulating substrate 31 and the submodule 1; and the second sealing material 34 sealing the region surrounded by the case 33 so that at least the upper surface of the submodule 1 is exposed.

Accordingly, the submodule 1 is not completely covered by the second sealing material 34, but at least the upper surface (surface in the Z direction) of the submodule 1 is exposed, thus the submodule 1 can be easily taken out from the semiconductor device without melting the second sealing material 34. Accordingly, the submodule 1 can be reused. As a result, environmental load can be reduced in each stage in a life cycle of products.

The semiconductor element 11 is a most expensive member in the semiconductor device, and in particular, manufacturing cost of the semiconductor element 11 made up of the SiC wide bandgap semiconductor is expensive, and there is a large cost difference between the semiconductor element 11 and the other member, thus the semiconductor element 11 is worthy of being reused. The plurality of semiconductor elements 11 are collected in one submodule 1, thus the submodule 1 as a collected unit can be taken out and attached again, and the semiconductor element 11 having a high unit price can be efficiently reused.

The cooler 32 and the case 33 constituting an outer peripheral part of the semiconductor device may be deteriorated, deformed, and damaged in a step of being mounted to the inverter and a step of being taken out from the inverter, however, the submodule 1 included in the semiconductor device is not influenced by these conditions, thus is appropriate to be reused. It is easy to deal with the submodule 1 compared with a single body of the semiconductor element 11, and an electrical inspection can be performed under thermally and electrically strict conditions, thus a test time for ensuring reliability can be reduced as much as possible.

The semiconductor device further includes the conducting electrode 22 connected to the semiconductor element 11 and the connection members 35 and 35A connecting the conducting electrode 22 and the circuit pattern 31c of the insulating substrate 31, and a part of the connection members 35 and 35A is exposed to the second sealing material 34.

Accordingly, an operator can hold the connection members 35 and 35A and take out the submodule 1 from the semiconductor device. The insulation distance from the circuit pattern 31c to the conducting electrode 22 can be made long by the connection members 35 and 35A, thus the insulation properties can be easily and reliably ensured.

The connection member 35A has the loop shape on the upper surface (surface in the Z direction) of the submodule 1, thus the strap can be inserted into this loop shape to take out the submodule 1 from the semiconductor device.

Young's modulus of the second sealing material 34 is lower than that of the first sealing material 24. Specifically, the first sealing material 24 is made up of epoxy system resin, and the second sealing material 34 is made up of gel or rubber. Accordingly, the submodule 1 can be easily separated and taken out from the second sealing material 34.

The sintering bonding has a longer thermal cycle life than the solder bonding, and the epoxy resin sealing prevents ingress of moisture compared with the gel sealing, and suppresses moisture deterioration of the semiconductor element 11, thus easily increases a life of the semiconductor device. However, when the sintering bonding and the epoxy resin sealing is adopted to the whole semiconductor device, an assembling step is complicated, and a manufacturing facility is upsized, thus manufacturing cost increases. In the embodiment 1, the sintering bonding and the epoxy resin sealing is not adopted in manufacturing the submodule 1, thus the manufacturing facility is not upsized but can be communalized with the other type of semiconductor device, and manufacturing cost of the semiconductor device can be suppressed.

The upper surface (surface in the Z direction) of the submodule 1 is not completely covered with the second sealing material 34 but is exposed from the second sealing material 34, thus the insulation properties of the region around the semiconductor element 11 is ensured by the first sealing material 24, and the submodule 1 can be easily taken out from the semiconductor device without melting the first sealing material 24.

A part of the connection members 35 and 35A is exposed from the second sealing material 34, however, the connection members 35 and 35A have potential equivalent to an upper surface electrode (source electrode) of the semiconductor element 11, and source potential is also applied to the signal terminal 23, thus even when the part of the connection members 35 and 35A is exposed from the second sealing material 34, a problem of insulation properties hardly occurs. The insulation distance from the cooler 32 to the circuit pattern 31c, from the circuit pattern 31c to the circuit pattern 31c, and from the cooler 32 to the connection members 35 and 35A needs to be designed to be small as much as possible to downsize the semiconductor device, thus it is preferable to ensure the insulation properties by covering them with the second sealing material 34.

The melting point of the first bonding material 13 is higher than that of the second bonding material 12. Specifically, the first bonding material 13 is the sintering bonding material, and the second bonding material 12 is the solder material. Accordingly, when the second bonding material 12 is melted to take out the submodule 1, the deformation and the deterioration of an inner portion of the submodule 1 can be suppressed.

The level difference 38 protruding to the inner peripheral side is provided on the inner peripheral wall 33a of the case 33, the area of the portion on the upper side (Z direction) of the level difference 38 in a top view is larger than the area of the portion on the lower side (−Z direction) of the level difference 38 in a top view in the region surrounded by the case 33, and the insulating substrate 31 is disposed in the portion on the lower side (−Z direction) of the level difference 38 in the region surrounded by the case 33.

Accordingly, in the step of filling the region with the second sealing material 34, after filling the region with the second sealing material 34 up to the upper side (Z direction) of the circuit pattern 31c of the insulating substrate 31, the speed of increasing the volume of the second sealing material 34 is reduced, and the upper surface (surface in the Z direction) of the submodule 1 can be more reliably exposed.

Embodiment 2

Figure 5:
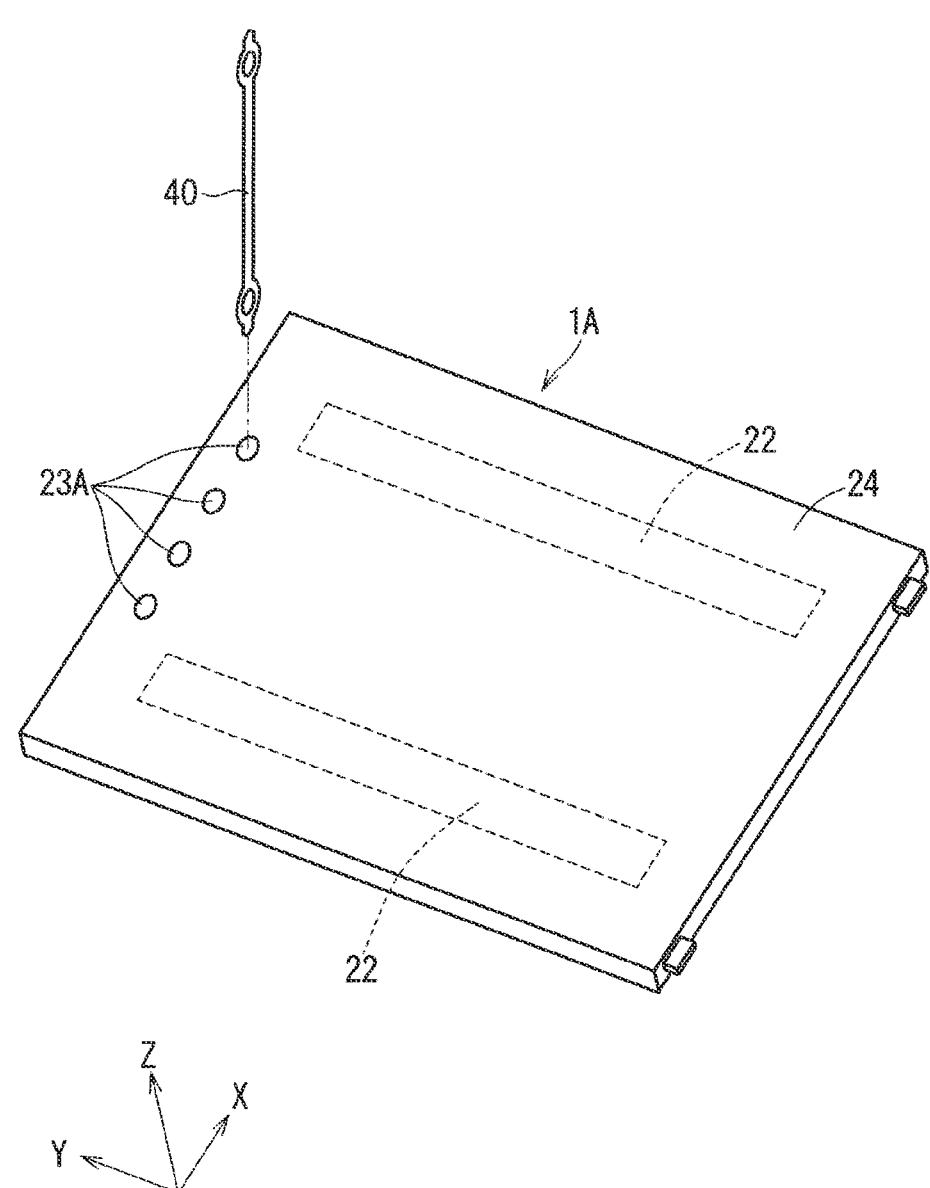
FIG. 5 is a perspective view of a submodule included in a semiconductor device according to an embodiment 2.

A semiconductor device according to an embodiment 2 is described next. FIG. 5 is a perspective view of a submodule 1A included in the semiconductor device according to the embodiment 2. In the description in the embodiment 2, the same reference numerals are assigned to the same constituent elements as those described in the embodiment 1, and the description thereof will be omitted.

As illustrated in FIG. 5, in the embodiment 2, four signal terminals 23A are provided in place of four signal terminals 23 in the submodule 1A. Each signal terminal 23A is formed into a cylindrical shape having a hole not shown in the drawings. Each signal terminal 23A is sealed by the first sealing material 24 so that the upper surface (surface in the Z direction) as a part of each signal terminal 23A is exposed to the upper surface (surface in the Z direction) of the submodule 1A.

The semiconductor device includes eight external signal terminals 40 having the press fit terminal on both end portions, and in each submodule 1A, one end portions of four external signal terminals 40 are inserted to holes not shown in the drawings in four signal terminal 23A, respectively, and the other end portions of four external signal terminals 40 are inserted into four holes not shown in the drawings but formed in the control substrate 36 (refer to FIG. 3), respectively, thus four signal terminals 23A and the control substrate 36 are electrically connected via four external signal terminals 40. FIG. 5 illustrates only one external signal terminal 40. At the time of taking out the submodule 1A, the external signal terminal 40 inserted into the hole in the signal terminal 23A is pulled out, and the new external signal terminal 40 is used at the time of mounting the submodule 1A again.

Action and Effect

The semiconductor device according to the embodiment 2 further includes the control substrate 36 disposed on the upper side (Z direction) of the submodule 1A and controlling the semiconductor element 11 and the signal terminal 23A connecting the semiconductor element 11 and the control substrate 36, and a part of the signal terminal 23A is sealed with the first sealing material 24 to be exposed to the upper surface (surface in the Z direction) of the submodule 1A.

Accordingly, properties of taking out the submodule 1A can be ensured while the insulation properties of the signal terminal 23A and the circuit pattern 31c is ensured.

The semiconductor device further includes the external signal terminal 40 connecting the control substrate 36 and the signal terminal 23A, and the signal terminal 23A is formed into the cylindrical shape having the hole into which one end portion of the external signal terminal 40 is inserted.

Accordingly, properties of taking out the external signal terminal 40 can be ensured. Particularly, when both end portions of the external signal terminal 40 is the press fit terminal, even if the external signal terminal 40 is deformed at the time of taking out the submodule 1A, the deformed external signal terminal 40 can be easily replaced with a new external signal terminal 40.

Embodiment 3

Figure 6:
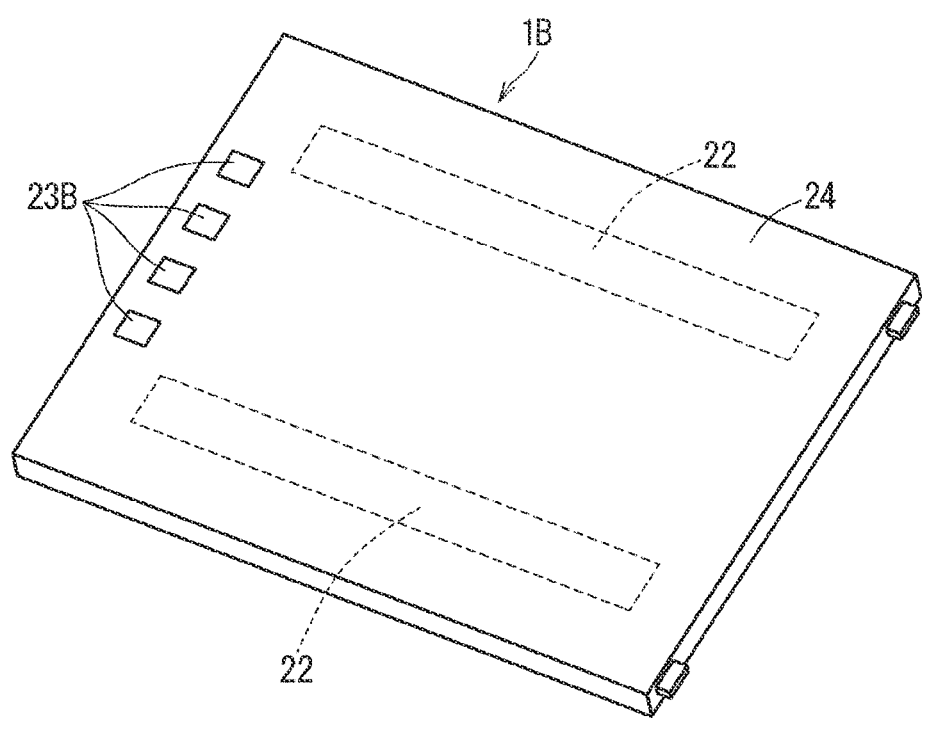
FIG. 6 is a perspective view of a submodule included in a semiconductor device according to an embodiment 3.
Figure 6:
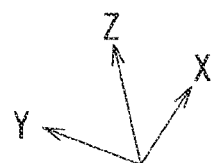

A semiconductor device according to an embodiment 3 is described next. FIG. 6 is a perspective view of a submodule 1B included in the semiconductor device according to the embodiment 3. In the description in the embodiment 3, the same reference numerals are assigned to the same constituent elements as those described in the embodiments 1 and 2, and the description thereof will be omitted.

As illustrated in FIG. 6, in the embodiment 3, four signal terminals 23B are provided in place of four signal terminals 23 in the submodule 1B. Each signal terminal 23B is formed into a rectangular cylindrical shape with no hole, and is sealed by the first sealing material 24 so that the upper surface (surface in the Z direction) as a part of each signal terminal 23B is exposed to the upper surface (surface in the Z direction) of the submodule 1B.

Although not shown in the drawings, eight second signal terminals are provided in the case 33 (refer to FIG. 3), and eight second signal terminals and eight signal terminals 23B included in two submodules 1B are connected to each other, respectively, via a wire made of Al or Cu. Furthermore, eight signal terminals 23B are also connected to the control substrate 36 (refer to FIG. 3) via a wire made of Al or Cu.

Action and Effect

The semiconductor device according to the embodiment 3 further includes the control substrate 36 disposed on the upper side (Z direction) of the submodule 1B and controlling the semiconductor element 11 and the signal terminal 23B connecting the semiconductor element 11 and the control substrate 36, and a part of the signal terminal 23B is sealed with the first sealing material 24 to be exposed to the upper surface (surface in the Z direction) of the submodule 1B.

Accordingly, properties of taking out the submodule 1B can be ensured while the insulation properties of the signal terminal 23B and the circuit pattern 31c is ensured.

The second signal terminal provided to the case 33 is adopted, thus even if the second signal terminal is deformed at the time of taking out the submodule 1B, the deformed second signal terminal can be easily replaced with a new second signal terminal.

Other Modification Example

The configuration of the semiconductor device according to the modification example of the embodiment 1 may be combined with the semiconductor device according to the embodiments 2 and 3.

Each embodiment can be arbitrarily combined, or each embodiment can be appropriately varied or omitted.

The aspects of the present disclosure are collectively described hereinafter as an additional statement.

(Additional Statement 1)

A semiconductor device, comprising:

a submodule in which a conductive plate and a semiconductor element mounted to an upper surface of the conductive plate via a first bonding material are sealed with a first sealing material;

an insulating substrate bonded to a lower surface of the submodule via a second bonding material;

a case surrounding a periphery of the insulating substrate and the submodule; and a second sealing material sealing a region surrounded by the case so that at least an upper surface of the submodule is exposed.

(Additional Statement 2)

The semiconductor device according to the additional statement 1, further comprising a conducting electrode connected to the semiconductor element and a connection member connecting the conducting electrode and a circuit pattern of the insulating substrate, wherein a part of the connection member is exposed from the second sealing material.

(Additional Statement 3)

The semiconductor device according to the additional statement 2, wherein the connection member has a loop shape on the upper surface of the submodule.

(Additional Statement 4)

The semiconductor device according to any one of the additional statements 1 to 3, further comprising a control substrate disposed on an upper side of the submodule and controlling the semiconductor element and a signal terminal connecting the semiconductor element and the control substrate, wherein a part of the signal terminal is sealed with the first sealing material so as to be exposed to the upper surface of the submodule.

(Additional Statement 5)

The semiconductor device according to the additional statement 4, further comprising an external signal terminal connecting the control substrate and the signal terminal, wherein the signal terminal is formed into a cylindrical shape having a hole into which one end portion of the external signal terminal is inserted.

(Additional Statement 6)

The semiconductor device according to any one of the additional statements 1 to 5, wherein Young's modulus of the second sealing material is lower than Young's modulus of the first sealing material.

(Additional Statement 7)

The semiconductor device according to any one of the additional statements 1 to 6, wherein the first sealing material is made up of epoxy system resin, and the second sealing material is made up of gel or rubber.

(Additional Statement 8)

The semiconductor device according to any one of the additional statements 1 to 7, wherein a melting point of the first bonding material is higher than a melting point of the second bonding material.

(Additional Statement 9)

The semiconductor device according to any one of the additional statements 1 to 8, wherein the first bonding material is a sintering bonding material, and the second bonding material is a solder material.

(Additional Statement 10)

The semiconductor device according to any one of the additional statements 1 to 9, wherein a level difference protruding to an inner peripheral side is provided to an inner peripheral wall of the case, an area of a portion on an upper side of the level difference in a top view is larger than an area of a portion on a lower side of the level difference in a top view in the region surrounded by the case, and the insulating substrate is disposed in the portion on the lower side of the level difference in the region surrounded by the case.

(Additional Statement 11)

A method of manufacturing a semiconductor device, comprising:

(a) a step of mounting a semiconductor element to an upper surface of the conductive plate via a first bonding material to prepare a submodule including the conductive plate and the semiconductor element sealed with the first sealing material; and (b) a step of bonding a lower surface of the submodule and the insulating substrate by a second bonding material, locating a case to surround a periphery of the insulating substrate and the submodule, and sealing the region surrounded by the case with the second sealing material so that at least an upper surface of the submodule is exposed.

(Additional Statement 12)

A method of manufacturing another semiconductor device using the semiconductor device according to any one of the additional statements 1 to 10, comprising:

(c) a step of taking out the submodule from the second sealing material; and (d) a step of bonding a lower surface of the submodule which has been taken out and another insulating substrate different from the insulating substrate by another second bonding material different from the second bonding material, locating another case different from the case to surround a periphery of the another insulating substrate and the submodule, and sealing the region surrounded by the another case with another second sealing material different from the second sealing material so that at least the upper surface of the submodule is exposed.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:

a submodule in which a conductive plate and a semiconductor element mounted to an upper surface of the conductive plate via a first bonding material are sealed with a first sealing material;

an insulating substrate bonded to a lower surface of the submodule via a second bonding material;

a case surrounding a periphery of the insulating substrate and the submodule; and a second sealing material sealing at least lateral sides of the insulating substrate and a region surrounded by the case so that at least an upper surface of the submodule is exposed.

2. The semiconductor device according to claim 1, further comprising a conducting electrode connected to the semiconductor element and a connection member connecting the conducting electrode and a circuit pattern of the insulating substrate, wherein a part of the connection member is exposed from the second sealing material.

3. The semiconductor device according to claim 2, wherein the connection member has a loop shape on the upper surface of the submodule.

4. The semiconductor device according to claim 1, further comprising a control substrate disposed on an upper side of the submodule and controlling the semiconductor element and a signal terminal connecting the semiconductor element and the control substrate, wherein a part of the signal terminal is sealed with the first sealing material so as to be exposed to the upper surface of the submodule.

5. The semiconductor device according to claim 4, further comprising an external signal terminal connecting the control substrate and the signal terminal, wherein the signal terminal is formed into a cylindrical shape having a hole into which one end portion of the external signal terminal is inserted.

6. The semiconductor device according to claim 1, wherein

Young's modulus of the second sealing material is lower than Young's modulus of the first sealing material.

7. The semiconductor device according to claim 1, wherein the first sealing material is made up of epoxy system resin, and the second sealing material is made up of gel or rubber.

8. The semiconductor device according to claim 1, wherein a melting point of the first bonding material is higher than a melting point of the second bonding material.

9. The semiconductor device according to claim 1, wherein the first bonding material is a sintering bonding material, and the second bonding material is a solder material.

10. The semiconductor device according to claim 1, wherein a level difference protruding to an inner peripheral side is provided to an inner peripheral wall of the case, an area of a portion on an upper side of the level difference in a top view is larger than an area of a portion on a lower side of the level difference in a top view in the region surrounded by the case, and the insulating substrate is disposed in the portion on the lower side of the level difference in the region surrounded by the case.

11. A method of manufacturing another semiconductor device using the semiconductor device according to claim 1, comprising:

(c) a step of taking out the submodule from the second sealing material; and (d) a step of bonding a lower surface of the submodule which has been taken out and another insulating substrate different from the insulating substrate by another second bonding material different from the second bonding material, locating another case different from the case to surround a periphery of the another insulating substrate and the submodule, and sealing the region surrounded by the another case with another second sealing material different from the second sealing material so that at least the upper surface of the submodule is exposed.

12. The semiconductor device according to claim 1, wherein the second sealing material seals the insulating substrate and surrounds an outermost periphery of the insulating substrate.

13. A method of manufacturing a semiconductor device, comprising:

(a) a step of mounting a semiconductor element to an upper surface of a conductive plate via a first bonding material to prepare a submodule including the conductive plate and the semiconductor element sealed with a first sealing material; and (b) a step of bonding a lower surface of the submodule and an insulating substrate by a second bonding material, locating a case to surround a periphery of the insulating substrate and the submodule, and sealing at least lateral sides of the insulating substrate and a region surrounded by the case with a second sealing material so that at least an upper surface of the submodule is exposed.

14. The method according to claim 13, wherein the second sealing material seals the insulating substrate and surrounds an outermost periphery of the insulating substrate.

15. A semiconductor device, comprising:
a submodule in which a conductive plate and a semiconductor element mounted to an upper surface of the conductive plate via a first bonding material are sealed with a first sealing material;
an insulating substrate bonded to a lower surface of the submodule via a second bonding material;
a case surrounding a periphery of the insulating substrate and the submodule; and
a second sealing material sealing a region surrounded by the case so that at least an upper surface of the submodule is exposed, wherein
Young's modulus of the second sealing material is lower than Young's modulus of the first sealing material.

* * * * *